US007701274B2

(12) United States Patent
Chae

(10) Patent No.: US 7,701,274 B2
(45) Date of Patent: Apr. 20, 2010

(54) DELAY LOCKED LOOP FOR CONTROLLING DELAY TIME USING SHIFTER AND ADDER AND CLOCK DELAYING METHOD

(75) Inventor: Kwan-yeob Chae, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 24 days.

(21) Appl. No.: 12/013,607

(22) Filed: Jan. 14, 2008

(65) Prior Publication Data
US 2008/0197900 A1 Aug. 21, 2008

(30) Foreign Application Priority Data
Feb. 16, 2007 (KR) .................. 10-2007-0016792

(51) Int. Cl.
H03L 7/06 (2006.01)
(52) U.S. Cl. ...................... 327/158; 327/149
(58) Field of Classification Search .................. 327/147, 327/149, 156, 158
See application file for complete search history.

(56) References Cited

U.S. PATENT DOCUMENTS

| 6,215,726 | B1* | 4/2001 | Kubo | 365/233.17 |
| 6,762,974 | B1* | 7/2004 | Johnson et al. | 365/233.11 |
| 6,822,494 | B2 | 11/2004 | Kim | |
| 7,064,592 | B2* | 6/2006 | Jiang | 327/161 |
| 7,081,782 | B2* | 7/2006 | Kizer et al. | 327/158 |
| 7,109,767 | B1* | 9/2006 | Amick et al. | 327/158 |
| 7,355,922 | B2* | 4/2008 | Johnson et al. | 365/233.12 |
| 7,388,795 | B1* | 6/2008 | To et al. | 365/194 |
| 7,472,304 | B2* | 12/2008 | Malekkhosravi et al. | 713/401 |
| 7,480,203 | B2* | 1/2009 | Johnson et al. | 365/233.17 |
| 7,496,781 | B2* | 2/2009 | Tamura et al. | 713/600 |
| 7,541,879 | B2* | 6/2009 | Kato et al. | 331/16 |
| 2005/0206419 | A1* | 9/2005 | Kizer et al. | 327/158 |
| 2008/0180148 | A1* | 7/2008 | Lundberg | 327/158 |
| 2008/0232179 | A1* | 9/2008 | Kwak | 365/194 |
| 2009/0015338 | A1* | 1/2009 | Frey | 331/16 |
| 2009/0033386 | A1* | 2/2009 | Nisha et al. | 327/158 |
| 2009/0033388 | A1* | 2/2009 | Heragu et al. | 327/158 |

FOREIGN PATENT DOCUMENTS

KR 1020010091534 A 10/2001
WO 2005/061797 A1 7/2005

* cited by examiner

Primary Examiner—Lincoln Donovan
Assistant Examiner—Adam D Houston
(74) Attorney, Agent, or Firm—F. Chau & Associates, LLC

(57) ABSTRACT

A delay locked loop that controls a delay time period by using a shifter and an adder includes a master delay locked loop and a slave delay locked loop. The master delay locked loop outputs a first digital value corresponding to one clock cycle of a first input clock signal. The slave delay locked loop receives the first digital value and delays a second input clock signal for a time period smaller than the one clock cycle of the first input clock signal. The slave delay locked loop includes a shifter, an operator, and a variable delay circuit. The shifter shifts the first digital value to generate a second digital value. The operator adds or subtracts an offset value to or from the second digital value to generate a third digital value, wherein the offset value varies according to a process, a voltage, and a temperature (PVT). The variable delay circuit delays the second input clock signal for a time period corresponding to the third digital value.

13 Claims, 6 Drawing Sheets

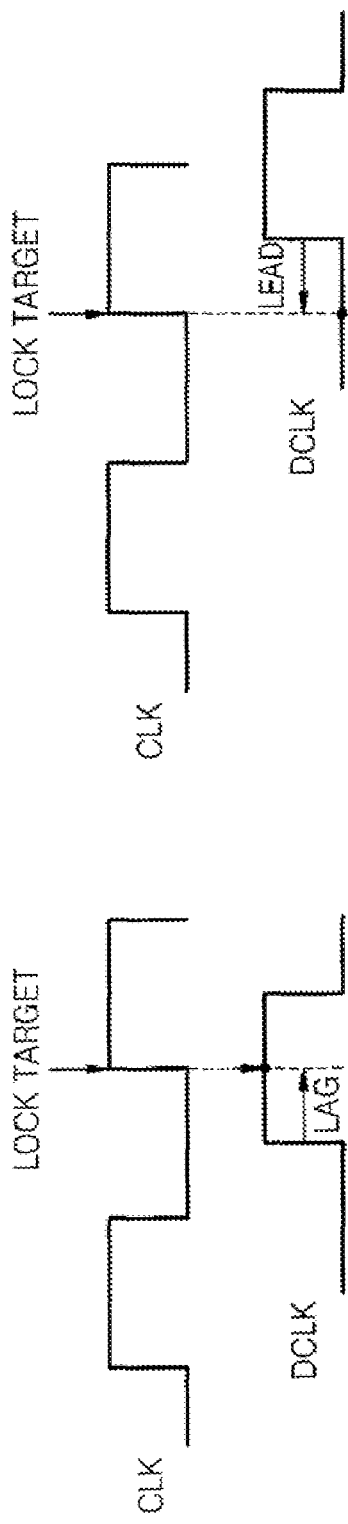
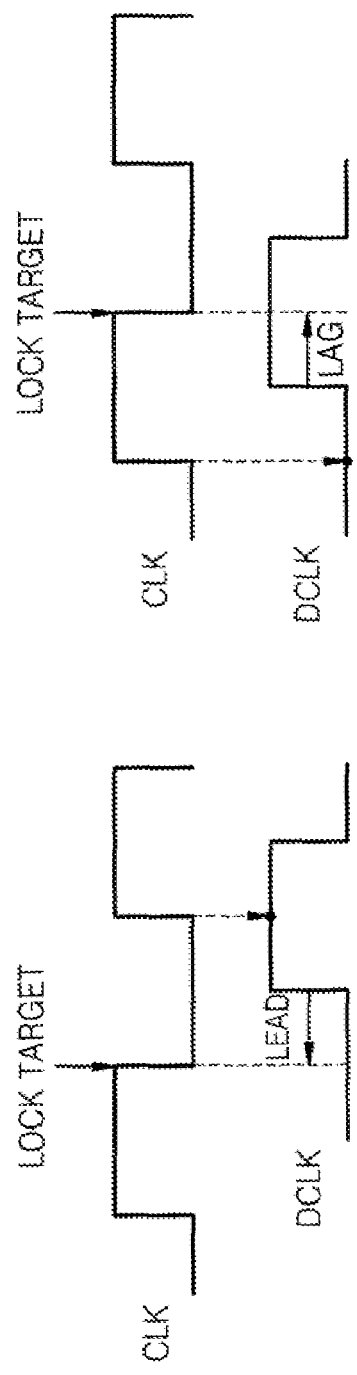
FIG. 4A
FIG. 4B

FIG. 5A

| SHIFT | CNTA | CNTB | CNTC | DELAY FROM IN TO OUT |
|---|---|---|---|---|
| 0 | $N$ $(N*tD=tCK)$ | $N$ | $N \pm \text{OFFSET}$ | $tCK \pm tD*\text{OFFSET}$ |
| 1 | | $N/2$ | $N/2 \pm \text{OFFSET}$ | $tCK/2 \pm tD*\text{OFFSET}$ |
| 2 | | $N/4$ | $N/4 \pm \text{OFFSET}$ | $tCK/4 \pm tD*\text{OFFSET}$ |
| 3 | | $N/8$ | $N/8 \pm \text{OFFSET}$ | $tCK/8 \pm tD*\text{OFFSET}$ |
| 4 | | $N/16$ | $N/16 \pm \text{OFFSET}$ | $tCK/16 \pm tD*\text{OFFSET}$ |
| n | | $N/2^n$ | $N/2^n \pm \text{OFFSET}$ | $tCK/2^n \pm tD*\text{OFFSET}$ |

FIG. 5B

| SHIFT | CNTA | CNTB | CNTC | DELAY FROM IN TO OUT |
|---|---|---|---|---|
| 0 | $N'$ $(N'*tD=tCK/2)$ | $2N'$ | $2*N' \pm \text{OFFSET}$ | $tCK \pm tD*\text{OFFSET}$ |
| 1 | | $N'$ | $N' \pm \text{OFFSET}$ | $tCK/2 \pm tD*\text{OFFSET}$ |
| 2 | | $N'/2$ | $N'/2 \pm \text{OFFSET}$ | $tCK/4 \pm tD*\text{OFFSET}$ |
| 3 | | $N'/4$ | $N'/4 \pm \text{OFFSET}$ | $tCK/8 \pm tD*\text{OFFSET}$ |
| 4 | | $N'/8$ | $N'/8 \pm \text{OFFSET}$ | $tCK/16 \pm tD*\text{OFFSET}$ |
| n | | $N'/2^{n-1}$ | $N'/2^{n-1} \pm \text{OFFSET}$ | $tCK/2^n \pm tD*\text{OFFSET}$ |

DELAY LOCKED LOOP FOR CONTROLLING DELAY TIME USING SHIFTER AND ADDER AND CLOCK DELAYING METHOD

CROSS-REFERENCE TO RELATED PATENT APPLICATION

This application claims the benefit of Korean Patent Application No. 10-2007-0016792, filed on Feb. 16, 2007, in the Korean Intellectual Property Office, the disclosure of which is incorporated herein in its entirety by reference.

BACKGROUND OF THE INVENTION

1. Technical Field

The present disclosure relates to a delay locked loop and, more particularly to a delay locked loop that controls a delay time period by using a shifter and an adder.

2. Discussion of Related Art

Delay locked loops (DLLs) remove a skew between an external clock signal input to an internal circuit and an internal clock signal used in the internal circuit. DLLs detect a difference between phases of the external clock signal and the internal clock signal and compensate for the detected phase difference, thereby removing a skew between the external clock signal and the internal clock signal.

SUMMARY OF THE INVENTION

Exemplary embodiments of the present invention provide a delay locked loop that controls a delay time period by using a shifter and an adder.

According to an exemplary embodiment of the present invention, there is provided a delay locked loop including: a master delay locked loop that outputs a first digital value corresponding to one clock cycle of a first input clock signal; and a slave delay locked loop that receives the first digital value and delays a second input clock signal for a time period smaller than the one clock cycle of the first input clock signal, wherein the slave delay locked loop includes: a shifter that shifts the first digital value to generate a second digital value; an operator that adds or subtracts an offset value to or from the second digital value to generate a third digital value, wherein the offset value varies according to a process, a voltage, and a temperature (PVT); and a variable delay circuit that delays the second input clock signal for a time period corresponding to the third digital value.

The shifter may shift bits included in the first digital value to the right.

The variable delay circuit may include a plurality of unit delay units serially connected to one another, each having a unit delay time period. The second input clock signal may be transmitted to some or all of the unit delay units, so as to be delayed for a time period corresponding to the third digital value.

Each of the unit delay units may include a buffer and a multiplexer. The buffers of the unit delay units may be serially connected to one another, the multiplexers of the unit delay units may be serially connected to one another, and the multiplexer of each of the unit delay units may select one of an output signal of a corresponding buffer and an output signal of a multiplexer immediately before it.

The delay locked loop may further include a decoder that receives the third digital value and generates selection signals in order to select some unit delay units to which the second input clock signal is to be transmitted from the plurality of unit delay units.

In a half-detection mode, the master delay locked loop may output a first digital value corresponding to half of one clock cycle of the first input clock signal.

The delay locked loop may further include a shift control unit that sets a shift value of the shifter in response to a half-detection mode signal that indicates the half-detection mode.

According to an exemplary embodiment of the present invention, there is provided a delay locked loop comprising: a master delay locked loop that detects a value corresponding to one clock cycle of a first input clock signal; and a slave delay locked loop that receives the value corresponding to one clock cycle of the first input clock signal and delays a second input clock signal for a time period smaller than the one clock cycle of the first input clock signal, wherein the slave delay locked loop includes: a shifter that divides the value corresponding to one clock cycle of the first input clock signal by a predetermined shift value to generate a second digital value; an operator that adds or subtracts an offset value to or from the second digital value to generate a third digital value, wherein the offset value varies according to a process, a voltage, and a temperature (PVT); and a variable delay circuit delaying the second input clock signal for a time period corresponding to the third digital value.

According to an exemplary embodiment of the present invention, there is provided a delay locked loop including: a shifter that shifts a first digital value corresponding to one clock cycle of a first input clock signal to generate a second digital value; an operator that adds or subtracts an offset value to or from the second digital value to generate a third digital value, wherein the offset value varies according to a process, a voltage, and a temperature (PVT); and a variable delay circuit that delays the second input clock signal for a time period corresponding to the third digital value.

The shift value may be a natural number greater than 1.

According to an exemplary embodiment of the present invention, there is provided a clock delaying method including the operations of: detecting a first digital value corresponding to one clock cycle of a first input clock signal; and receiving the first digital value and delaying a second input clock signal for a time period smaller than one clock cycle of the first input clock signal, wherein the operation of delaying the second input clock signal includes the sub-operations of: shifting the first digital value to generate a second digital value; adding or subtracting an offset value to or from the second digital value to generate a third digital value, wherein the offset value varies according to a process, a voltage, and a temperature (PVT); and delaying the second input clock signal for a time period corresponding to the third digital value.

BRIEF DESCRIPTION OF THE DRAWINGS

Exemplary embodiments of the present invention will be understood in more detail from the following descriptions taken in conjunction with the attached drawings, in which:

FIGS. 4A and 4B are timing diagrams for explaining operations of the DLL shown in FIG. 1 to remove a difference between phases of an input clock signal and an output clock signal in the normal mode and the half-detection mode, respectively;

FIGS. 5A and 5B are tables showing digital values in the normal mode and the half-detection mode, respectively, of the DLL of FIG. 1.

DETAILED DESCRIPTION OF EXEMPLARY EMBODIMENTS

Figure 1:
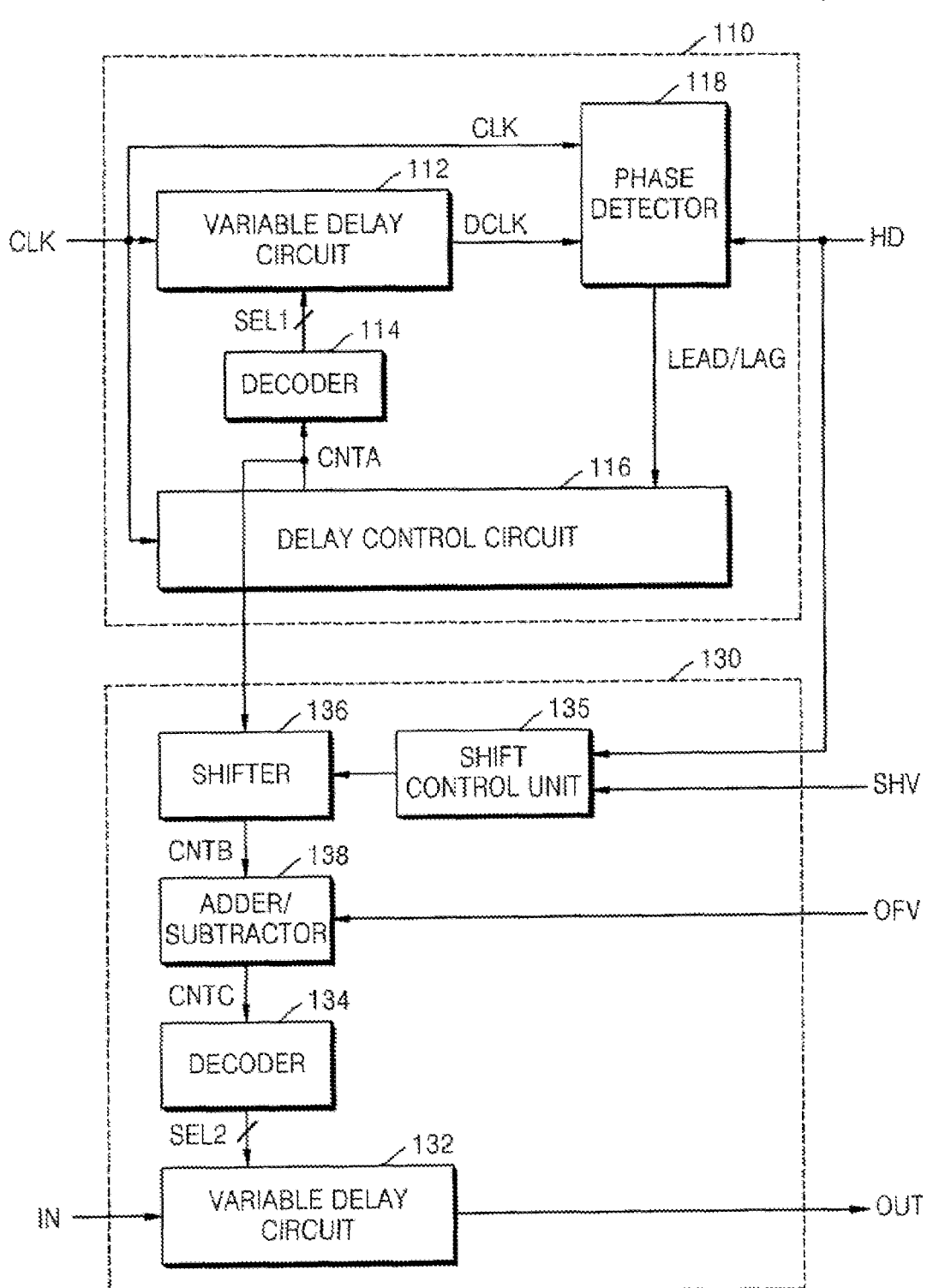
FIG. 1 is a block diagram of a delay locked loop (DLL) according to an exemplary embodiment of the present invention.

The attached drawings for illustrating exemplary embodiments of the present invention are referred to in order to gain a sufficient understanding of the present invention, the merits thereof, and the objectives accomplished by the implementation of exemplary embodiments of the present invention.

Hereinafter, the present invention will be described in detail by explaining exemplary embodiments of the present invention with reference to the attached drawings, wherein like reference numerals denote like elements.

FIG. 1 is a block diagram of a delay locked loop (DLL) according to an exemplary embodiment of the present invention. Referring to FIG. 1, the DLL 100 includes a master DLL 110 and a slave DLL 130.

The master DLL 110 detects a first digital value CNTA corresponding to one clock cycle of a first input clock signal CLK. The master DLL 110 may include a variable delay circuit 112, a decoder 114, a delay control circuit 116, and a phase detector 118.

The variable delay circuit 112 delays the first input clock signal CLK for a predetermined period of time to generate a first delay clock signal DCLK. The phase detector 118 detects a difference between phases of the first input clock signal CLK and the first delay clock signal DCLK to generate a lead signal LEAD or a lag signal LAG. For example, when the phase of the first input clock signal CLK is ahead of the phase of the first delay clock signal DCLK, the lead signal LEAD may be generated, and when the phase of the first input clock signal CLK is behind that of the first delay clock signal DCLK, the lag signal LAG may be generated. In response to the lead signal LEAD or the lag signal LAG, the delay control circuit 116 and the decoder 114 control the first delay clock signal DCLK and the first input clock signal CLK to have a phase difference corresponding to one clock cycle. More specifically, the delay control circuit 116 outputs a first digital value CNTA corresponding to one clock cycle of the first input clock signal CLK, and the decoder 114 decodes the first digital value CNTA to output a first decoded value set SEL1 fed to the variable delay circuit 112. The variable delay circuit 112 delays the first input clock signal CLK for a period of time corresponding to the first decoded value set SEL1.

The slave delay locked loop 130 delays a second input clock signal IN for a time period shorter than one clock cycle of the first input clock signal CLK. The slave delay locked loop 130 includes a shifter 136, an operator 138, and a variable delay circuit 132.

The shifter 136 shifts the first digital value CNTA to generate a second digital value CNTB. The shifter 136 can shift the bits of the first digital value CNTA to the right. Depending on the number of bits by which the shifter 136 shifts the bits included in the first digital value CNTA, a ratio of the first digital value CNTA to the second digital value CNTB varies. For example, when the shifter 136 shifts the bits included in the first digital value CNTA by one bit and the first digital value CNTA corresponding to one clock cycle of the first input clock signal CLK is '1000', the second digital value CNTB is '0100'. Accordingly, the second digital value CNTB is half of the first digital value CNTA. Also, when the shifter 136 shifts the bits included in the first digital value CNTA by two bits and the first digital value CNTA corresponding to one clock cycle of the first input clock signal CLK is '1000', the second digital value CNTB is '0010'. Accordingly, the second digital value CNTB is a quarter of the first digital value CNTA. Thus, the second digital value CNTB corresponds to a time period obtained by dividing one clock cycle of the first input clock signal CLK by a multiple of an integer. In other words, the second digital value CNTB corresponds to a time period shorter than one clock cycle of the first input clock signal CLK.

The operator 138 may be an adder/subtractor, and adds or subtracts a received offset value OFV, which varies according to a process, a voltage, and a temperature (PVT), to or from the second digital value CNTB and outputs a result of the addition or subtraction as a third digital value CNTC. Accordingly, the DLL 100 can compensate for the received offset value OFV. In other words, the third digital value CNTC output from the operator 138 is a value on which compensation according to PVT has been performed.

A decoder 134 decodes the third digital value CNTC to output a second decoded value set SEL2 fed to the variable delay circuit 132. The variable delay circuit 132 delays a second input clock signal IN for a period of time corresponding to the second decoded value set SEL2 to output an output clock signal OUT. Alternatively, if the decoder 134 is omitted, the variable delay circuit 132 delays the second input clock signal IN for a time period corresponding to the third digital value CNTC and outputs the output clock signal OUT.

Figure 2:
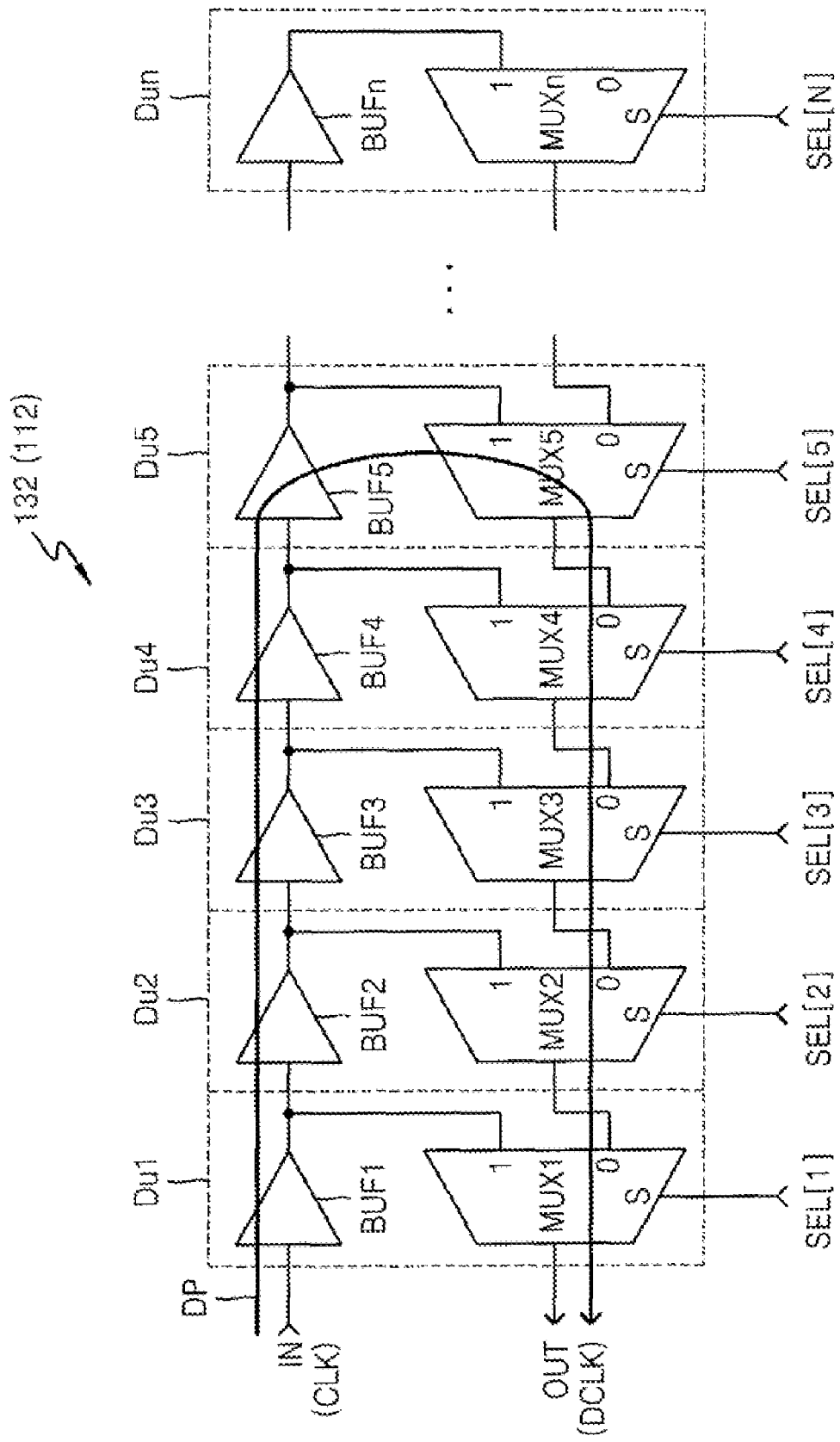
FIG. 2 is a circuit diagram of a variable delay circuit included in the DLL illustrated in FIG. 1.

FIG. 2 is a circuit diagram of the variable delay circuit 132 or 112 included in the DLL 100 illustrated in FIG. 1.

Referring to FIG. 2, the variable delay circuit 132 may include a plurality of unit delay units DU1 through DUn. The unit delay units DU1 through DUn are serially connected to one another and each has a unit delay time period. The second input clock signal IN is transmitted to some of the unit delay units DU1 through DUn and delayed for the time period corresponding to the third digital value CNTC. For example, transmission of the second input clock signal IN to only the first five unit delay units DU1 through DU5 is illustrated in FIG. 2. Accordingly, the variable delay circuit 132 delays the second input clock signal IN five times longer than the unit delay time period.

Each of the unit delay units DU1 through DUn may include a buffer and a multiplexer. The buffers BUF1 through BUFn of the unit delay units DU1 through DUn are serially connected to one another, and the multiplexers MUX1 through MUXn thereof may also be serially connected to one another. Each of the multiplexers MUX1 through MUXn may select either an output signal of a corresponding buffer or an output signal of a multiplexer immediately preceding the subject multiplexer and output the selected signal. For example, the multiplexer MUX5 of the fifth unit delay unit DU5 selects an output signal of a corresponding buffer BUF5, and the multiplexers MUX1 through MUX4 of the first through fourth unit delay units DU1 through DU4 select output signals of multiplexers immediately preceding the respective multiplexers. Accordingly, the second input clock signal IN can be transmitted to only the five unit delay units DU1 through DU5.

Referring back to FIG. 1, the DLL 100 may optionally include the decoder 134. Referring to FIG. 2, the decoder 134 decodes the third digital value CNTC and generates selection signals SEL1 through SELn in order to select some unit delay units, for example, the unit delay units DU1 through DU5, to which the second input clock signal IN is transmitted, from the unit delay units DU1 through DUn. For example, the selection signals SEL1 through SEL5 for selecting the unit delay units, for example, the unit delay units DU1 through DU5, to which the second input clock signal IN is transmitted may be generated as '1' and, thus, the corresponding multiplexers MUX1 through MUX5 can select the output signal of the multiplexers right before the corresponding multiplexers. Meanwhile, the other selection signals, for example, the n-th selection signal SELn, may be generated as '0', and thus corresponding multiplexers, for example, the multiplexer MUXn, select the output signals of the corresponding buffers, for example, the buffer BUFn.

Figure 3A:
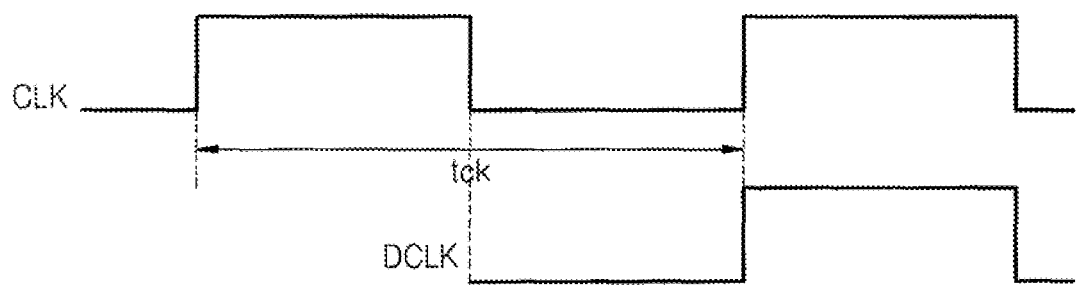
FIGS. 3A and 3B are timing diagrams for explaining a normal mode, in which the DLL of FIG. 1 delays an input clock signal for one cycle, and a half-detection mode, in which the DLL of FIG. 1 delays an input clock signal for half of one cycle.
Figure 3B:
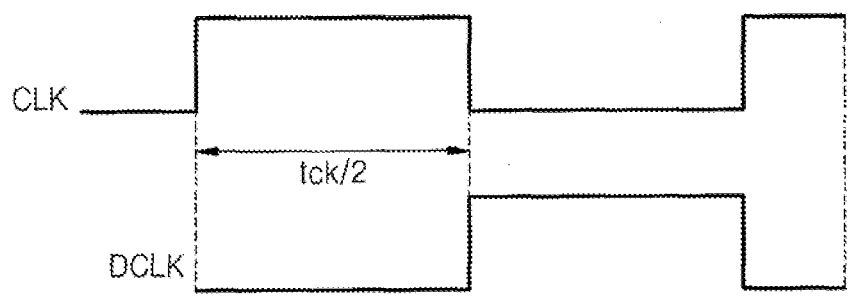

FIGS. 3A and 3B are timing diagrams for explaining a normal mode, in which the DLL 100 of FIG. 1 delays an input clock signal for one cycle, and a half-detection mode, in which the DLL 100 of FIG. 1 delays the input clock signal for half of one cycle.

FIGS. 4A and 4B are timing diagrams for explaining operations of the DLL 100 shown in FIG. 1 to remove a difference between phases of the input clock signal and an output clock signal in the normal mode and the half-detection mode, respectively.

FIGS. 5A and 5B are tables showing digital values in the normal mode and the half-detection mode, respectively, of the DLL 100 of FIG. 1.

The normal mode in which the DLL 100 delays the input clock signal for one cycle, and the half-detection mode, in which the DLL 100 delays the input clock signal for a half of one cycle, will now be described with reference to FIGS. 1 through 5B.

In the normal mode, the master DLL 110 outputs a first digital value CNTA corresponding to one clock cycle tck of the first input clock signal CLK. On the other hand, in the half-detection mode, the master DLL 110 outputs a first digital value CNTA corresponding to half of one clock cycle, that is, tck/2, of the first input clock signal CLK. FIG. 3A illustrates the normal mode in which the master DLL 110 generates the first delay clock signal DCLK by delaying the first input clock signal CLK for one clock cycle tck. FIG. 3B illustrates the half-detection mode in which the master DLL 110 generates the first delay clock signal DCLK by delaying the first input clock signal CLK for half of one clock cycle, tck/2.

In the normal mode and the half-detection mode, the phase detector 118 detects a difference between phases of the first input clock signal CLK and the first delay clock signal DCLK to generate the lead signal LEAD or the lag signal LAG. FIG. 4A illustrates detection of the difference between the phases of the first input clock signal CLK and the first delay clock signal DCLK in the normal mode. FIG. 4B illustrates detection of the difference between the phases of the first input clock signal CLK and the first delay clock signal DCLK in the half-detection mode. LOCK TARGET shown in FIGS. 4A, 4B, 5A and 5B indicates a target phase of the first delay clock signal DCLK.

Referring to FIG. 5A, in the normal mode, the second input clock signal IN is delayed for a time period "one clock cycle tck of first input clock signal CLK±offset value OFFSET". Referring to FIG. 5B, in the half-detection mode, the second input clock signal IN is delayed for a time period "2*half of one clock cycle, tck/2, of first input clock signal CLK±offset value OFFSET".

Referring back to FIG. 1, the DLL 100 may include a shift control unit 135. The shift control unit 135 sets a shift value of the shifter 136 in response to a half-detection mode signal HD that indicates the half detection mode and a shift signal SHV. The half-detection mode signal HD is also fed to the phase detector 118.

Figure 6:
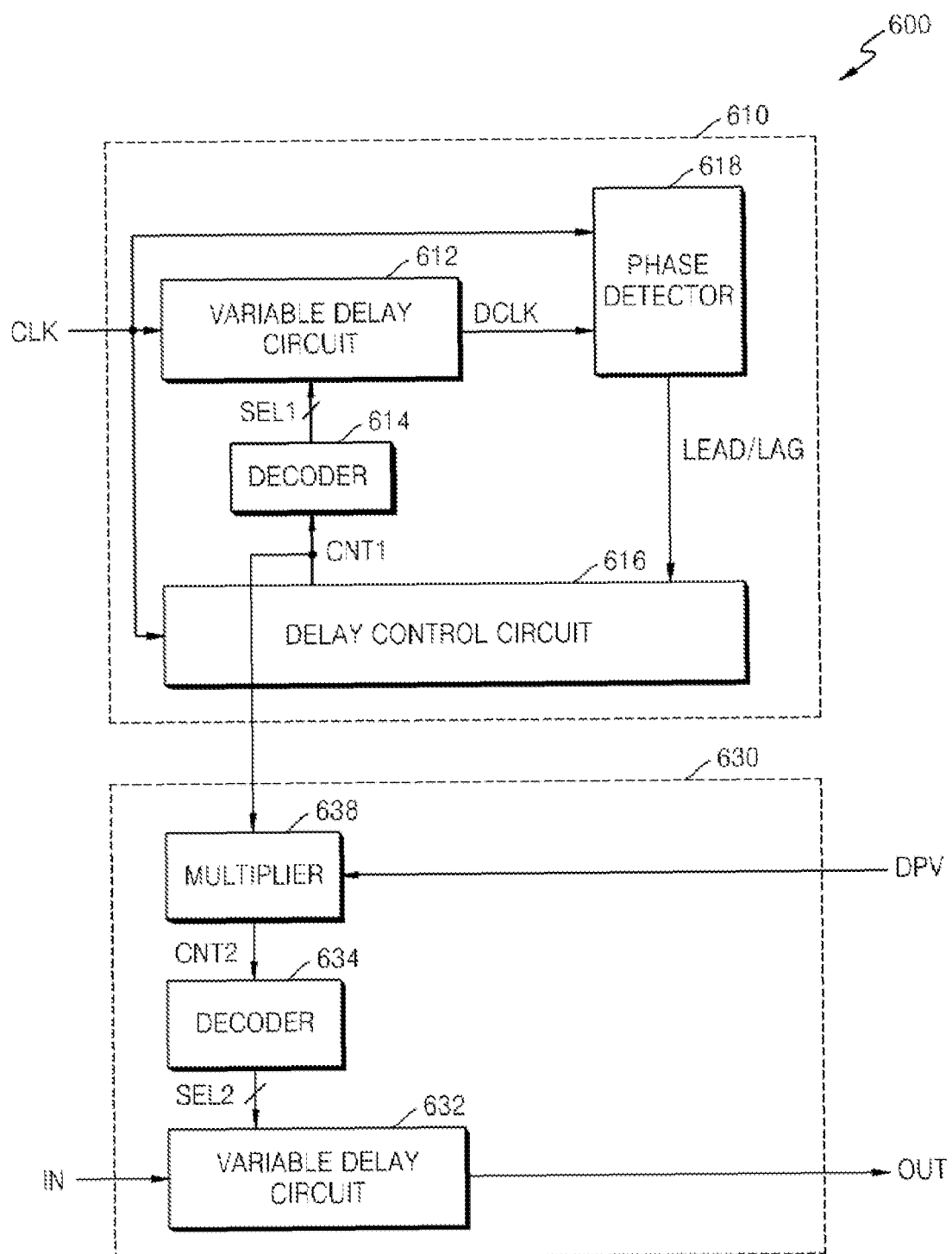
FIG. 6 is a block diagram of a DLL that can be compared with an exemplary embodiment of the present invention.

FIG. 6 is a block diagram of a DLL 600 having a master DLL 610 and a slave DLL 630 that can be compared with the exemplary embodiment of the present invention shown in FIG. 1 and the variable delay circuit 612, the decoder 614, the delay control circuit 616, the phase detector 618, the variable delay circuit 632, and the decoder 634 correspond to the like elements shown in FIG. 1 and need not be described again. Signal CNT1 corresponds to signal CNTA and signal CNT2 corresponds to signal CNTC of FIG. 1.

The DLL 600 determines a delay time period for the second input clock signal IN by multiplying a digital value CNT1 corresponding to one clock cycle of the first input clock signal CLK by a delay factor less than 1 based on received signal DPV. The DLL 600 performs the multiplication by using a multiplier 638. The multiplier 638, however, occupies a large area of the DLL 600. Also, the DLL 600 cannot compensate for an offset change depending on PVT.

On the other hand, the DLL 100 according to the exemplary embodiment of the present invention illustrated in FIG. 1 can compensate for the offset change depending on PVT by using the adder/subtractor operator 138. In addition, the DLL 100 determines a delay time period for the second input clock signal IN by using the shifter 136. The shifter 136 and the adder/subtractor operator 138 occupy smaller areas of the DLL 100 than the multiplier 638 of the DLL 600. Therefore, the size of the DLL 100 is smaller than that of the DLL 600.

A clock delaying method according to an exemplary embodiment of the present invention includes the operations of detecting a first digital value corresponding to one clock cycle of a first input clock signal, receiving the first digital value, and delaying a second input clock signal for a time period less than the one clock cycle of the first input clock signal.

The operation of delaying the second input clock signal includes a shifting sub-operation, an adding/subtracting operation, and a variable delaying operation. In the shifting operation, the first digital value is shifted to generate a second digital value. In the adding/subtracting operation, an offset value OFV that varies according to PVT is added to or subtracted from the second digital value to generate a third digital value. In the variable delaying operation, the second input clock signal is delayed for the time period corresponding to the third digital value.

The clock delaying method according to an exemplary embodiment of the present invention has the same technical spirit as the DLL 100, and the operations thereof correspond to the components of the DLL 100 shown in FIG. 1. Thus, the clock delaying method according to the exemplary embodiment of the present invention can be easily understood by one of ordinary skill in the art from the description of the DLL 100, therefore, a detailed description thereof will be omitted here.

As described above, a DLL according to an exemplary embodiment of the present invention controls a delay time period by using a shifter. Thus, the DLL of FIG. 1 has a smaller size than DLLs that control delay time periods by using multipliers. Moreover, the DLL according to an exemplary embodiment of the present invention controls a delay time period by using an adder or subtractor. Thus, the DLL according to an exemplary embodiment of the present invention can determine a delay time period in which an offset value that changes according to PVT is reflected.

While the present invention has been particularly shown and described with reference to exemplary embodiments thereof, it will be understood by those of ordinary skill in the art that various changes in form and details may be made therein without departing from the spirit and scope of the present invention, as defined by the following claims.

What is claimed is:

1. A delay locked loop comprising:
    a master delay locked loop outputting a first digital value corresponding to one clock cycle of a first input clock signal; and
    a slave delay locked loop receiving the first digital value and delaying a second input clock signal for a time period smaller than the one clock cycle of the first input clock signal,
    wherein the slave delay locked loop comprises:
        a shifter shifting the first digital value to generate a second digital value;
        an operator adding or subtracting an offset value to or from the second digital value to generate a third digital value, wherein the offset value varies according to a process, a voltage, and a temperature; and
        a variable delay circuit delaying the second input clock signal for a time period corresponding to the third digital value.

2. The delay locked loop of claim 1, wherein the shifter shifts bits included in the first digital value to the right.

3. The delay locked loop of claim 1, wherein the variable delay circuit comprises a plurality of serially connected unit delay units, each having a unit delay time period, and
    wherein the second input clock signal is transmitted to some of the unit delay units so as to be delayed for a time period corresponding to the third digital value.

4. The delay locked loop of claim 3, wherein each of the unit delay units comprises:
    a buffer; and
    a multiplexer,
    wherein the buffers of the unit delay units are serially connected to one another, the multiplexers of the unit delay units are serially connected to one another, and the multiplexer of each of the unit delay units selects one of an output signal of a corresponding buffer and an output signal of a multiplexer immediately before the multiplexer.

5. The delay locked loop of claim 3, further comprising a decoder receiving the third digital value and generating selection signals in order to select some unit delay units to which the second input clock signal is to be transmitted from the plurality of unit delay units.

6. The delay locked loop of claim 1, wherein in a half-detection mode, the master delay locked loop outputs a first digital value corresponding to half of one clock cycle of the first input clock signal.

7. The delay locked loop of claim 6, further comprising a shift control unit setting a shift value of the shifter in response to a half-detection mode signal fed thereto that indicates the half detection mode.

8. A delay locked loop comprising:
    a shifter shifting a first digital value corresponding to one clock cycle of a first input clock signal to generate a second digital value;
    an operator adding or subtracting an offset value to or from the second digital value to generate a third digital value, wherein the offset value varies according to a process, a voltage, and a temperature; and
    a variable delay circuit delaying a second input clock signal for a time period, smaller than the one clock cycle of the first input clock signal, corresponding to the third digital value.

9. The delay locked loop of claim 8, wherein the shifter shifts bits included in the first digital value to the right.

10. A clock delaying method comprising:
    detecting a first digital value corresponding to one clock cycle of a first input clock signal; and
    receiving the first digital value and delaying a second input clock signal for a time period smaller than one clock cycle of the first input clock signal,
    wherein the delaying of the second input clock signal comprises:
        shifting the first digital value to generate a second digital value;
        adding or subtracting an offset value to or from the second digital value to generate a third digital value, wherein the offset value varies according to a process, a voltage, and a temperature; and
        delaying the second input clock signal for a time period corresponding to the third digital value.

11. The clock delaying method of claim 10, wherein in the shifting of the first digital value, bits included in the first digital value are shifted to the right.

12. The clock delaying method of claim 10, wherein in the detecting of the first digital value, a first digital value corresponding to half of one clock cycle of the first input clock signal is detected in a half-detection mode.

13. The clock delaying method of claim 12, further comprising setting a shift value used in the shifting step in response to a half-detection mode signal that indicates the half-detection mode.

* * * * *